(12) United States Patent
McNamara et al.

(10) Patent No.: US 6,629,281 B1
(45) Date of Patent: Sep. 30, 2003

(54) METHOD AND SYSTEM FOR AT SPEED DIAGNOSTICS AND BIT FAIL MAPPING

(75) Inventors: Timothy G. McNamara, Fishkill, NY (US); William V. Huott, Holmes, NY (US); Timothy J. Koprowski, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 09/669,917

(22) Filed: Sep. 26, 2000

(51) Int. Cl.$^7$ .................... G11C 29/00; G01R 31/28; G01R 31/02
(52) U.S. Cl. .................... 714/733; 714/718; 324/763
(58) Field of Search ................ 714/724, 733, 714/718, 738; 324/763

(56) References Cited

U.S. PATENT DOCUMENTS

| | | | |
|---|---|---|---|
| 4,482,953 A | 11/1984 | Burke .................... 714/27 |
| 5,138,619 A | 8/1992 | Fasang et al. ............ 714/718 |
| 5,404,332 A | 4/1995 | Sato et al. ............... 365/201 |
| 5,568,437 A | 10/1996 | Jamal .................... 365/201 |
| 5,570,375 A | 10/1996 | Tsai et al. ............... 714/727 |
| 5,633,877 A * | 5/1997 | Shephard et al. .......... 714/725 |
| 5,644,699 A | 7/1997 | Yoshida .................. 714/7 |
| 5,673,273 A * | 9/1997 | Almy .................... 714/724 |
| 5,740,412 A * | 4/1998 | Chan et al. .............. 713/600 |
| 5,745,500 A | 4/1998 | Damarla et al. .......... 714/732 |
| 5,771,242 A | 6/1998 | Adams et al. ............ 714/738 |
| 5,796,745 A | 8/1998 | Adams et al. ............ 714/718 |
| 5,805,789 A * | 9/1998 | Huott et al. ............. 714/7 |
| 5,883,843 A * | 3/1999 | Hii et al. ................ 365/201 |
| 5,912,901 A | 6/1999 | Adams et al. ............ 714/733 |
| 5,982,189 A * | 11/1999 | Motika et al. ............ 324/763 |
| 5,987,632 A | 11/1999 | Irrinki et al. ............ 714/711 |
| 6,073,258 A * | 6/2000 | Wheater .................. 714/718 |
| 6,330,681 B1 * | 12/2001 | Cote et al. .............. 713/322 |
| 6,393,594 B1 * | 5/2002 | Anderson et al. .......... 714/738 |
| 6,425,103 B1 * | 7/2002 | Phan .................... 714/733 |
| 6,438,722 B1 * | 8/2002 | Bailey et al. ............ 714/736 |

* cited by examiner

Primary Examiner—Albert Decady
Assistant Examiner—Anthony T. Whittington
(74) Attorney, Agent, or Firm—Lynn Augspurger; Cantor Colburn LLP

(57) ABSTRACT

This invention describes a method and apparatus, contained within an integrated circuit, for isolating failure by precisely controlling the number of clocks applied during built-in self-test (BIST). A programmable clock counter, on the integrated circuit, stores a specified number of clock cycles and sends a signal to stop a BIST engine once the specified number of clock cycles have been generated. The intermediate results can then be mapped bit by bit in order to isolate the cause of failure.

8 Claims, 2 Drawing Sheets

METHOD AND SYSTEM FOR AT SPEED DIAGNOSTICS AND BIT FAIL MAPPING

FIELD OF THE INVENTION

The invention relates to testing integrated circuits, and, more particularly, to a method and apparatus for isolating failure by precisely controlling the number of clocks applied during built-in self-test (BIST).

BACKGROUND OF THE INVENTION

Built-in self-test (BIST) is used to test the memory arrays and logic circuits that are contained in high-end processors. BIST allows the memory arrays and logic circuits to be tested at and above system clock speeds using a locally generated pattern set that verifies functionality. Conceptually, the BIST approach is based on the realization that much of a circuit tester's electronics is semiconductor-based, just like the products it is testing, and that many of the challenges and limitations in testing lie in the interface to the device under test (DUT). The BIST approach can be described as an attempt to move many of the already semiconductor-based test equipment functions into the products under test and eliminate the complex interfacing. One of the major advantages BIST has over other means of testing memory arrays is that the operation of the test is self-contained. All of the circuitry required to execute the test at-speed is contained within the integrated circuit. Very limited external controls are needed, so BIST can be run at all levels of packaging (wafer, TCA, module and system) without requiring expensive external test equipment.

BIST utilizes a boundary-scan design-for-test (DFT) technique. The DFT technique consists of placing a scannable memory element, or boundary-scan chain, adjacent to each integrated circuit I/O so that signals at the integrated circuit boundaries can be controlled and observed using scan operations and without direct contact with the integrated circuit. Access to the boundary-scan chain as well as to most of the DFT and BIST circuitry is through a custom five-wire interface similar to the standard IEEE 1149.1 TAP approach. This interface is used to initialize and control the various BIST controllers on the integrated circuits and other DFT hardware during both system test and manufacturing test. A state machine within each integrated circuit, referred to as the self-test control macro (STCM) is used to control internal-test-mode signals and the sequencing of all test and system clocks while in test mode. Instead of testing the performance of the device at full speed through the pins, an on-chip phase-locked loop (PLL) is used to multiply the incoming tester frequency to bring it up to the operating frequency of the integrated circuit. Additional self-generated clock (SGC) circuitry is then used to generate the various system clock sequences needed to properly exercise all portions of the integrated circuit. The BIST techniques can be divided into two major categories: logic BIST (LBIST) to test at-speed the logic in the devices, and array BIST (ABIST) to provide at-speed testing of the embedded arrays (i.e., RAMs).

Today, BIST engines are used to test logic and arrays by applying a large number of test patterns and compressing the results of these test patterns into a single signature. This signature is then compared to the one and only passing signature to determine if the logic or array that was tested is "good". If the signature does not match the expected good signature, the logic or array is considered to have failed and thus have one or more defects. There is difficulty in diagnosing what defect is causing the failing signature. It is useful to determine what the failing defect is and whether there is any defect pattern that may indicate a weak design or processing sensitivity causing the failing signature, rather than just random defects.

BRIEF SUMMARY OF THE INVENTION

This invention describes a method and apparatus, contained within an integrated circuit, for isolating failure by precisely controlling the number of clocks applied during built-in self-test (BIST). A programmable clock counter, on the integrated circuit, stores a specified number of clock cycles and sends a signal to stop the BIST once the specified number of clock cycles have been generated. The intermediate results can then be mapped at speed bit by bit in order to isolate the cause of failure.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1:
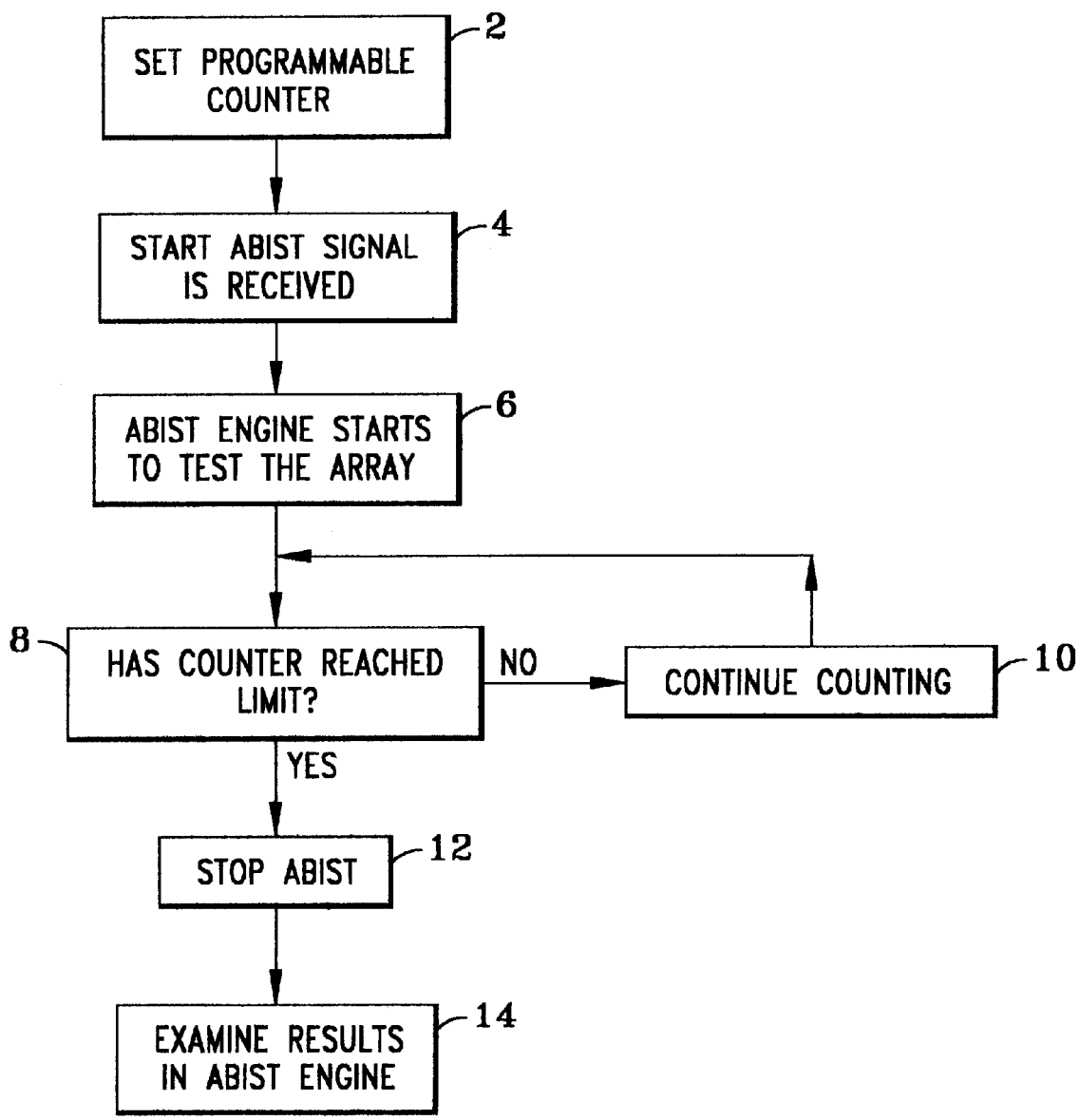
FIG. 1 depicts the overall flow of the method for at speed diagnostics and bit fail mapping.

FIG. 1 depicts the overall flow of a method for at speed diagnostics and bit fail mapping using ABIST as an example implementation. First, in step 2, a programmed delay is set in a programmable clock counter and next a signal to start the ABIST test is received in step 4. This signal to start could come from a slow asynchronous tester, for example. In response to this signal, the ABIST engine starts to test the array in step 6. While the test is being performed, the programmable clock counter is checked to see if it has reached the programmed delay. The programmable clock counter may count up from zero or down from some value to provide the programmed delay. If the programmable clock counter has not reached the programmed delay, the programmable clock counter continues running in step 10 and the value of the programmable clock counter is again checked to see if it has reached the programmed delay in step 8. This loop of steps 8 and 10 continues and the ABIST engine continues to run until the value of the programmable clock counter reaches the programmed delay. When the programmable clock counter reaches the programmed delay, the ABIST test is halted in step 12 and the tester can scan out and examine the intermediate results in the ABIST engine 108 at step 14.

Figure 2:
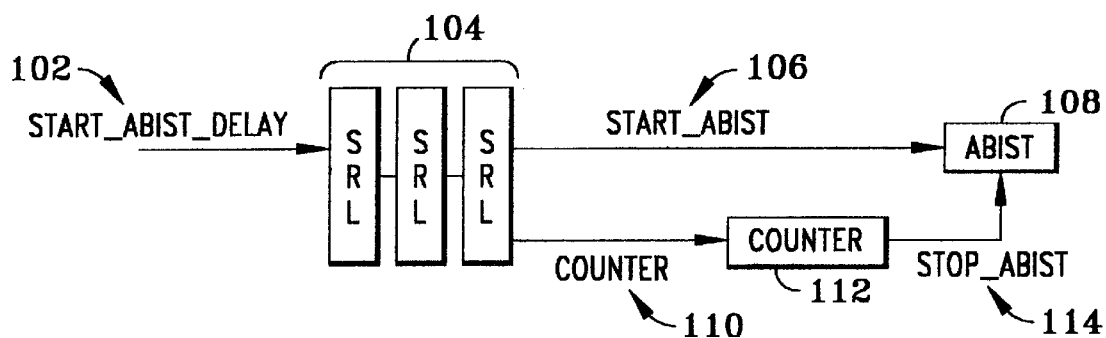
FIG. 2 depicts a hardware implementation of the at speed diagnostics and bit fail mapping invention.

FIG. 2 depicts an exemplary hardware implementation of at speed diagnostics and bit fail mapping using ABIST as an example. A START_ABIST_DELAY signal 102 is applied to a latch device 104. In an exemplary embodiment, the latch device 104 includes a plurality of shift register latches (SRLs) connected in series. The latch device 104 effectively delays the START_ABIST_DELAY signal 102 and generates both a synchronous START_ABIST signal 106 and a synchronous COUNTER signal 110. The START_ABIST signal 106 starts the ABIST engine 108 to initiate the self test. The COUNTER signal 110 starts the programmable clock counter 112 that has been programmed with a programmable delay. Once the programmable clock counter 112 reaches the programmable delay, a STOP_ABIST signal 114 is generated which causes the ABIST engine 108 to stop.

Figure 3:
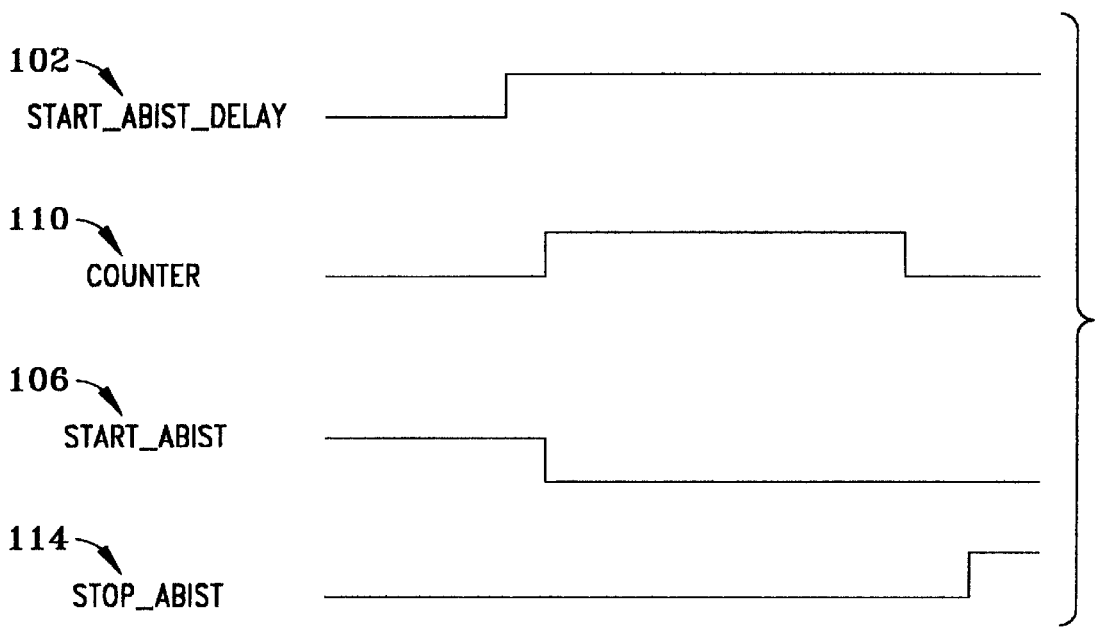
FIG. 3 depicts a timing diagram of the at speed diagnostics and bit fail mapping invention.

FIG. 3 illustrates an exemplary timing diagram of at speed diagnostics and bit fail mapping using ABIST as an example. First, the START_ABIST_DELAY signal 102 is received, from a slow asynchronous tester, for example. Some time after the START_ABIST_DELAY signal 102 goes high, both the START_ABIST signal 106 will drop and the COUNTER signal 110 will rise in the exact same cycle in response to an output of latch device 104. When START_ABIST signal 106 drops, the ABIST engine 108 will start to test the array. When the COUNTER signal 110 rises, the programmable clock counter 112 will start counting and count until the programmed delay is reached. When the programmable clock counter 112 reaches the programmed delay, the programmable clock counter 112 will raise the STOP_ABIST signal 114. When the STOP_ABIST signal 114 goes high, this stops the ABIST engine 108. At this point, the. tester can scan out and examine the intermediate result in the ABIST engine 108. Thus, by changing the programmed delay in the programmable clock counter 112, the entire array could be bit mapped cycle by cycle to determine which bit or bits are failing in the array and whether the defects are random or indicate a design or process sensitivity.

Although the above discussion focuses on ABIST, those skilled in the art will recognize that this technique could be applied to any self-test engine, such as LBIST or other ABIST designs, as a means of isolating failures by precisely controlling the number of clocks applied during the self-test.

Since the design is contained on the integrated circuit that is being tested and utilizes the clock system on the integrated circuit, a slow inexpensive tester can be used to start the test and the test can be performed at system clock speeds and thus be used to diagnose difficult AC defects. Also, since this solution is contained entirely on the integrated circuit, it can be used at higher levels of packaging such as MCM and system test, where no high-speed tester interface is available.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of testing an integrated circuit comprising a built-in self test (BIST) engine, said method comprising:

receiving a BIST start signal;

delaying said BIST start signal;

initiating said BIST engine in response to said delayed BIST start signal;

initiating a programmable clock counter in response to said delayed BIST start signal, said programmable clock counter and said BIST engine being initiated at the same time, said programmable clock counter generating a BIST stop signal upon reaching a delay;

stopping said BIST engine in response to said BIST stop signal; and mapping output of said BIST engine, bit by bit, to isolate a cause of failure.

2. The method as recited in claim 1 wherein said BIST is an array built-in-self-test (ABIST).

3. The method as recited in claim 1 wherein said BIST is a logic built-in self-test (LBIST).

4. The method as recited in claim 1 wherein said delay is programmable.

5. A built-in self-test (BIST) apparatus contained within an integrated circuit, said apparatus comprising:

a BIST engine for performing said BIST, said BIST engine located on said integrated circuit, said BIST engine delaying a BIST start signal and initiating said BIST in response to said delayed BIST start signal and ending said BIST in response to a stop BIST stop signal; and a programmable clock counter located on said integrated circuit, said programmable clock counter being initiated in response to said delayed BIST start signal and generating said BIST stop signal upon reaching a delay;

said programmable clock counter and said BIST engine being initiated at the same time.

6. The apparatus as recited in claim 5, wherein said BIST is an array built-in self-test (ABIST) machine.

7. The apparatus as recited in claim 5, wherein said BIST is a logic built-in self-test (LBIST) machine.

8. The apparatus as recited in claim 5, wherein said delay is programmable.

* * * * *